United States Patent [19]

Usujima

[11] Patent Number: 5,789,141

[45] Date of Patent: Aug. 4, 1998

[54] PHOTOLITHOGRAPHY OF CHEMICALLY AMPLIFIED RESIST UTILIZING 200°C MINIMUM HEAT TREATMENT OF UNCOATED SUBSTRATE

[75] Inventor: Akihiro Usujima, Kawasaki, Japan

[73] Assignee: Fujitsu Limited, Kawasaki, Japan

[21] Appl. No.: 788,028

[22] Filed: Jan. 23, 1997

Related U.S. Application Data

[63] Continuation of Ser. No. 491,109, Jun. 16, 1995, abandoned.

[30] Foreign Application Priority Data

Jul. 7, 1994 [JP] Japan .................................. 6-156247

[51] Int. Cl.⁶ ............................................. G03C 5/00
[52] U.S. Cl. .................. 430/313; 430/330; 156/659.11; 427/534; 427/541
[58] Field of Search .............................. 437/228; 430/313, 430/330; 156/659.1, 659.11; 427/534, 535, 541, 543, 545

[56] References Cited

U.S. PATENT DOCUMENTS

| | | | |
|---|---|---|---|
| 4,645,683 | 2/1987 | Gourrier et al. | 427/535 |
| 4,871,580 | 10/1989 | Schram et al. | 427/535 |

FOREIGN PATENT DOCUMENTS

A3-141632  6/1991  Japan .

*Primary Examiner*—Christopher G. Young
*Attorney, Agent, or Firm*—Armstrong, Westerman, Hattori, McLeland & Naughton

[57] ABSTRACT

A method of manufacturing a semiconductor device comprising the steps of heating a substrate at a temperature not less than 200° C., for example 800° C., for a sufficient period; cooling the substrate down to room temperature; coating a chemically amplified resist film on the surface of the substrate; exposing a patterning region of the resist film; developing the resist film to form a resist pattern; and etching the surface of the substrate by a certain thickness, employing the resist pattern as a mask. In forming fine resist pattern using chemically amplified resist, resolution can be improved.

30 Claims, 4 Drawing Sheets

PHOTOLITHOGRAPHY OF CHEMICALLY AMPLIFIED RESIST UTILIZING 200°C MINIMUM HEAT TREATMENT OF UNCOATED SUBSTRATE

This application is Continuation of application Ser. No. 08/491,109 filed Jun. 16, 1995, now abandoned.

BACKGROUND OF THE INVENTION a. Field of the Invention

The present invention relates to a manufacturing method of semiconductor devices, and, more particularly to a method of forming resist patterns in photolithography process.

b. Description of the Related Art

Recently, with an increasing demand for increasing integration density of integrated circuits, miniaturization of circuit patterns are requested. For miniaturizing circuit patterns, higher resolution of exposure devices and shorter wavelength of exposing light have been developed. Such a trend further demands a higher resolution also to the resist film itself. In this trend, a chemically amplified resist including a photo-acid generating agent is attracting attention.

A conventional method of forming resist patterns using a chemically amplified resist will be described below.

A chemically amplified resist is first spin-coated on a semiconductor substrate, and then is subjected to pre-exposure baking (pre-baking). A pattern is exposed on a predetermined region of the resist film subjected to pre-baking by irradiating an ionizing radiation beam that can ionize a predetermined object substrate. Acid is generated by this irradiation only in the region irradiated by the ionizing radiation beam. An ultraviolet light beam such as of excimer laser, or other beam such as electron beam is employed as the ionizing radiation beam.

After exposing the pattern, the resist film is subjected to post-exposure baking (post-baking). When the chemically amplified resist is of positive type, the acid generated during the irradiation of ionizing radiation beam solubilizes base polymers during the post-exposure baking process. A resist pattern is formed by developing the resist after the post-baking. In this process, since the acid works as a catalyst to solubilize the base polymers, the sensitivity for exposure is improved as a result.

When basic (alkaline) impurities like ammonia, amine etc., contained in a clean room attach on the substrate surface before spin coating of the resist, they can neutralize the acid generated by the irradiation of exposure beam. For a positive resist, part of the resist in a neighborhood of the interface of the substrate becomes hard to be dissolved. Thus, there may occur a phenomenon of so-called tailing or trailing. When tailing occurs, the resist is left unremoved at portions near the interface of the substrate at the peripheral region where the ionizing radiation beam is irradiated. There may also occur such a phenomenon that patterns cannot be resolved in the region of irradiation of the ionizing radiation beam, because the resist near the interface of the substrate cannot be removed.

On the other hand, for a resist film of the negative type, basic impurity materials attached on the substrate surface work to solubilize the resist near the interface of the substrate. Thus, there may occur a phenomenon which may be called intrusion. Intrusion is a phenomenon that the resist near the interface of the substrate is dissolved at the time of developing in the neighborhood of the periphery of the region where the ionizing radiation beam has been irradiated.

SUMMARY OF THE INVENTION

An object of the present invention is to provide a method of forming resist patterns that can improve resolving power in the process of forming a micro resist pattern using a chemically amplified resist.

According to one aspect of the present invention, there is provided a method of manufacturing a semiconductor device comprising the steps of heating an object substrate at a temperature not less than 200° C. for a sufficient period, cooling the object substrate down to room temperature, forming a resist film by coating the surface of the object substrate with a chemically amplified resist, exposing a patterning region of the resist film, forming the resist pattern by developing the resist film, and etching the surface of the object substrate by a thickness employing the resist pattern as a mask.

By providing a thermal treatment not less than 200° C. before coating with resist, basic impurity materials attached on the substrate surface can be removed. Thus, the change in the characteristics of the resist can be prevented. For example, the resist film can be prevented to become hard to be dissolved, in the case of a positive resist, and prevented to become soluble, in the case of a negative resist near the interface of the substrate.

Generation of the so-called tailing or intrusion phenomena at the time of development can be suppressed, because the resist is prevented to become hard to be dissolved or to become soluble, against the expected function. Thus, an improvement in the resolving power of resist pattern becomes possible.

Thus, a fine resist pattern can be formed with a good resolving power. Thereby, a higher integration of the large scale integrated circuit LSI becomes possible.

DESCRIPTION OF THE PREFERRED EMBODIMENTS

Hereunder, an embodiment of the present invention will be described referring to FIG. 1.

Figure 1:
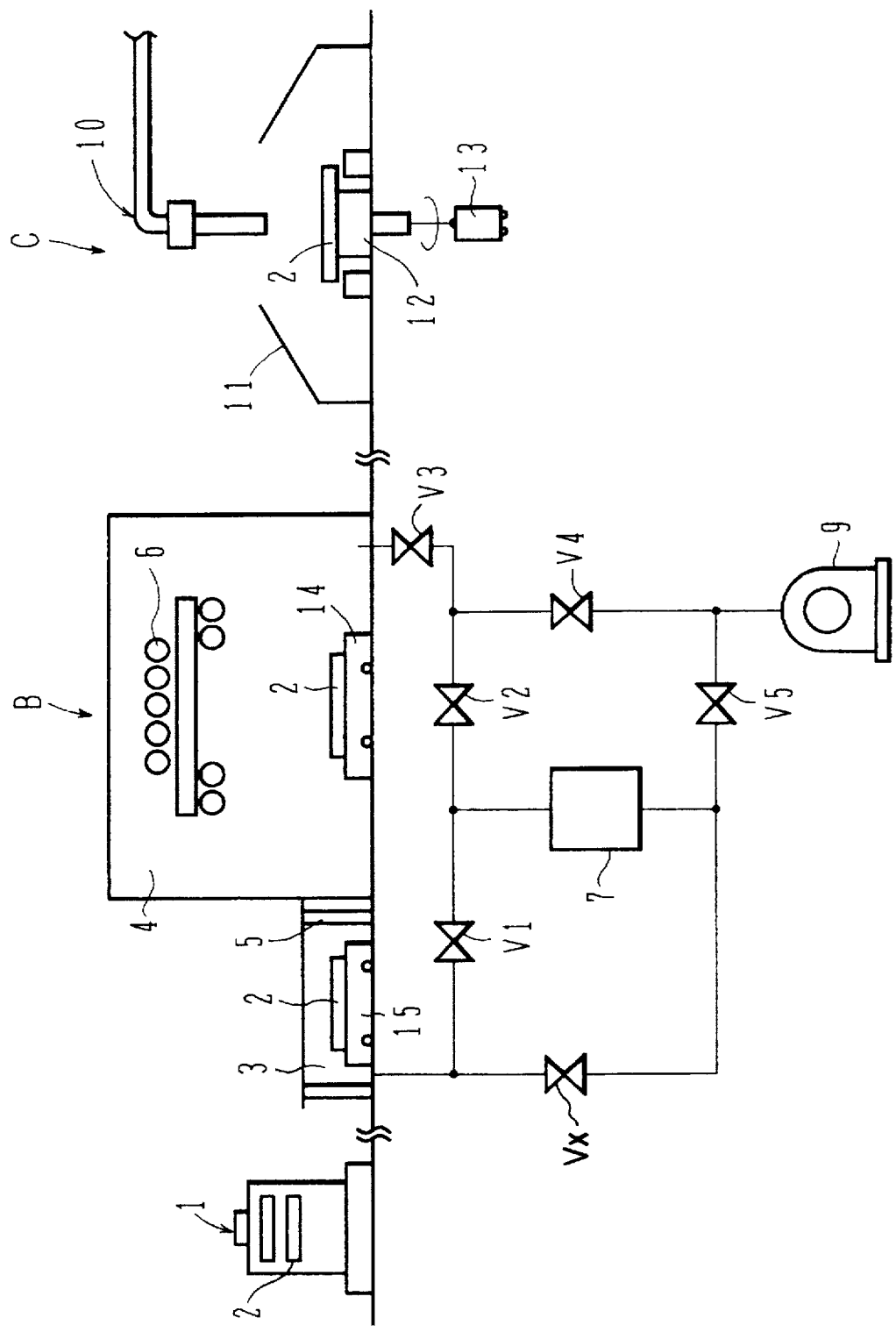
FIG. 1 is a schematic diagram showing a baking apparatus and a resist coating apparatus used in an embodiment of the present invention.

FIG. 1 shows schematically a baking apparatus B, and a coating apparatus C of resist used in the embodiment. The baking apparatus B comprises a subsidiary chamber 3, a main chamber 4, and a gas evacuating system. The subsidiary chamber 3 is connected to the main chamber 4 via a shutter 5. Inner space of each chamber is separable from each other by closing the shutter 5. A carrier robot not shown in the figure carries wafers to and from the subsidiary chamber 3 and the main chamber 4 when the shutter 5 is open.

A wafer stage 15 for mounting the wafer is disposed in the subsidiary chamber 3. A stage 14 with cooling water circulation, in which cooling water can circulate, is disposed in the main chamber 4. An infrared lamp 6 is disposed above the water-cooled stage 14. The infrared lamp 6 can heat a wafer mounted on the water-cooled stage 14.

A rotary pump 9 can provide a preparatory evacuation of the space inside the subsidiary chamber 3 via vacuum valves Vx and V5. The rotary pump 9 can provide a preparatory evacuation also of the space inside the main chamber 4 via vacuum valves V3 and V4.

A turbo molecular pump 7 can further evacuate the space inside the subsidiary chamber to high vacuum via a vacuum valve V1. The turbo molecular pump 7 can also evacuate the space inside the main chamber to high vacuum via vacuum valves V3 and V2. The exhaust side of the turbo molecular pump 7 is evacuated by the rotary pump 9 via the vacuum valve V5.

The resist coating apparatus C comprises a spinner chuck 12, a motor 13, a dispenser nozzle 10 disposed above the spinner chuck 12, and a coating cup 11 disposed around the spinner chuck 12 for preventing resist to scatter outside. While rotating a wafer 2 attached to the spinner chuck 12 by vacuum suction, the wafer 2 can be coated with resist by dripping the resist material from the dispenser nozzle 10.

A wafer carrier 1, the baking apparatus B, and the resist coating apparatus C, disposed on a production line, are connected in-line. The carrier robot not shown in the figure carries wafers among the apparatuses. A plurality of wafers 2 are contained in the wafer carrier 1 shown in the figure.

Next, a method of forming a resist pattern utilizing the system of FIG. 1 is described.

First, a surface of a silicon substrate is subjected to a primary oxidization in an atmosphere of chloric acid at a temperature of 1000° C. for about 20 minutes for forming an $SiO_2$ film with a thickness around 5 nm. Then, an SiN film with a thickness around 15 nm is formed by a low pressure chemical vapor deposition (LP-CVD) at a substrate temperature of 800° C. using ammonia and dichlorosilane as reaction gases. Wafers thus formed with a nitride film on a surface thereof are accommodated in the wafer carrier 1. The SiN film will be used as a mask in a step of local oxidation of silicon (LOCOS) later.

A wafer 2 accommodated in the wafer carrier 1 is carried by the carrier robot not shown in the figure and mounted on the wafer stage 15 in the subsidiary chamber 3. Here, the space inside the main chamber 4 is normally kept to a high vacuum. After evacuating the subsidiary chamber 3 to a high vacuum, the shutter 5 is opened for shifting the wafer to the stage 14 in the main chamber 4.

The wafer 2 is heated by the infrared lamp 6 at a temperature of 800° C. for 20 minutes. Thereafter, cooling water is circulated in the stage 14 for cooling the wafer 2 near the room temperature, e.g. to a temperature of 18°–25° C.

When the wafer is cooled, it is taken out of the chamber via the subsidiary chamber 3 and is immediately vacuum-sucked on the spinner chuck 12 in the resist coating apparatus C. While rotating the spinner chuck 12 at a preselected rotation rate, chemically amplified resist material of positive type is dripped on the surface of the wafer 2 from the dispenser nozzle 10. Thus, a resist film having a thickness around 0.7 μm is formed on the surface of the wafer 2. Chemically amplified resist material of positive type comprising, for example, a compound formed by tert-butoxycarbonyloxidizing 40% of hydroxyl of solution of polyvinylphenol, triphenylsulfonium triflate, and ethyl lactate may be employed.

After formation of a resist film, the wafer is subjected to pre-exposure baking on a hot plate at a temperature of about 110° C. for 90 seconds.

Thereafter, the resist film is selectively exposed using a KrF laser light with a wavelength of 248 nm. Immediately after exposure, the wafer is post-baked on the hot plate at a temperature of 90° C. for 90 seconds.

After the post-exposure baking, paddle development is exercised for 60 seconds using aqueous solution of tetra-methyl-ammonium-hydroxide (TMAH) with a concentration of 2.38%. Here, paddle development is a method of developing a photosensitive material with a developing agent placed on a wafer by the use of surface tension.

Heating before coating of a resist layer, in the above manner, is considered to eliminate contaminants attached to the surface of the wafer. Such contaminants may include adhesion or deposit of basic (alkaline) impurities on a wafer, such as ammonia and amine in a clean room, and adhesion or deposit ascribed to previous process by basic (alkaline) gas or liquid, etc. Thereby, the neighborhood of the interface of the resist layer with the wafer will not become hard to be dissolved, so that almost all of the resist layer in the exposed region will be removed.

Since boundaries of resist patterns are formed precisely, the SiN film underneath the resist mask can be etched with high precision. Further, after etching the SiN pattern, a field oxide film with a thickness of 40 nm is formed by selective oxidation using the SiN film as a mask, for example, in an $H_2O$ atmosphere at a substrate temperature of 900° C. Since the pattern of the SiN film used as a mask is formed highly precisely, a field oxide film can be formed at desired regions precisely.

Though the above described embodiment employs a chemically amplified positive resist material, other types of chemically amplified resist can also be used. For example, a chemically amplified resist of negative type comprising a base polymer of polyvinylphenol, a crosslinker of hexamethylmethylolmelamine, a photo-acid generator of tris-2,3-dibromopropylisocyanurate, and a solvent of propylene-glycol-monomethyl-ether acetate (PGMEA) may be used. In this case, it is preferable to do pre-baking at a temperature of 110° C. for 90 seconds and to do post-baking at a temperature of 120° C. for 60 seconds.

In the case of using the above described chemically amplified resist of the negative type, heating before coating of a resist layer can prevent the resist to become soluble in the neighborhood of the interface with the wafer. Thus, the resist remains firmly in contact with the wafer at the peripheries around the exposed region, so that the intrusion will not occur.

In the above description of the embodiment, the wafer is heated to 800° C. before coating of a resist layer. Similar effect will also be obtained with heating at a temperature not less than 200° C.

It is considered that basic impurities attach easily to the substrate surface when there exist hydroxyl groups. The hydroxyl is mostly attached by van der Waals force, so that it is expected to be dissociated by heating with a temperature between 100° and 400° C. or above. Most of the basic impurities are considered to be removed by heating a substrate at a temperature not less than 200° C., for the sake of safety.

Also in a case when basic impurity is simply adhered on a wafer surface, similar effect can be expected by heating the wafer to 200° C. or above. Heating period can be varied depending on the temperature provided that sufficient effect of removing alkaline adhesion is achieved.

Further, cleaning process may be employed before heating, which is done prior to coating a resist layer in the above embodiment. For example, a vapor phase processing of the wafer surface using plasma asher, cleaning or washing with a mixed solution of sulfuric acid and hydrogen peroxide water, or irradiation of far ultraviolet ray may be performed. These cleaning processes will be described hereunder.

First, description on vapor phase processing of the wafer surface using a plasma asher will be made.

Figure 2:
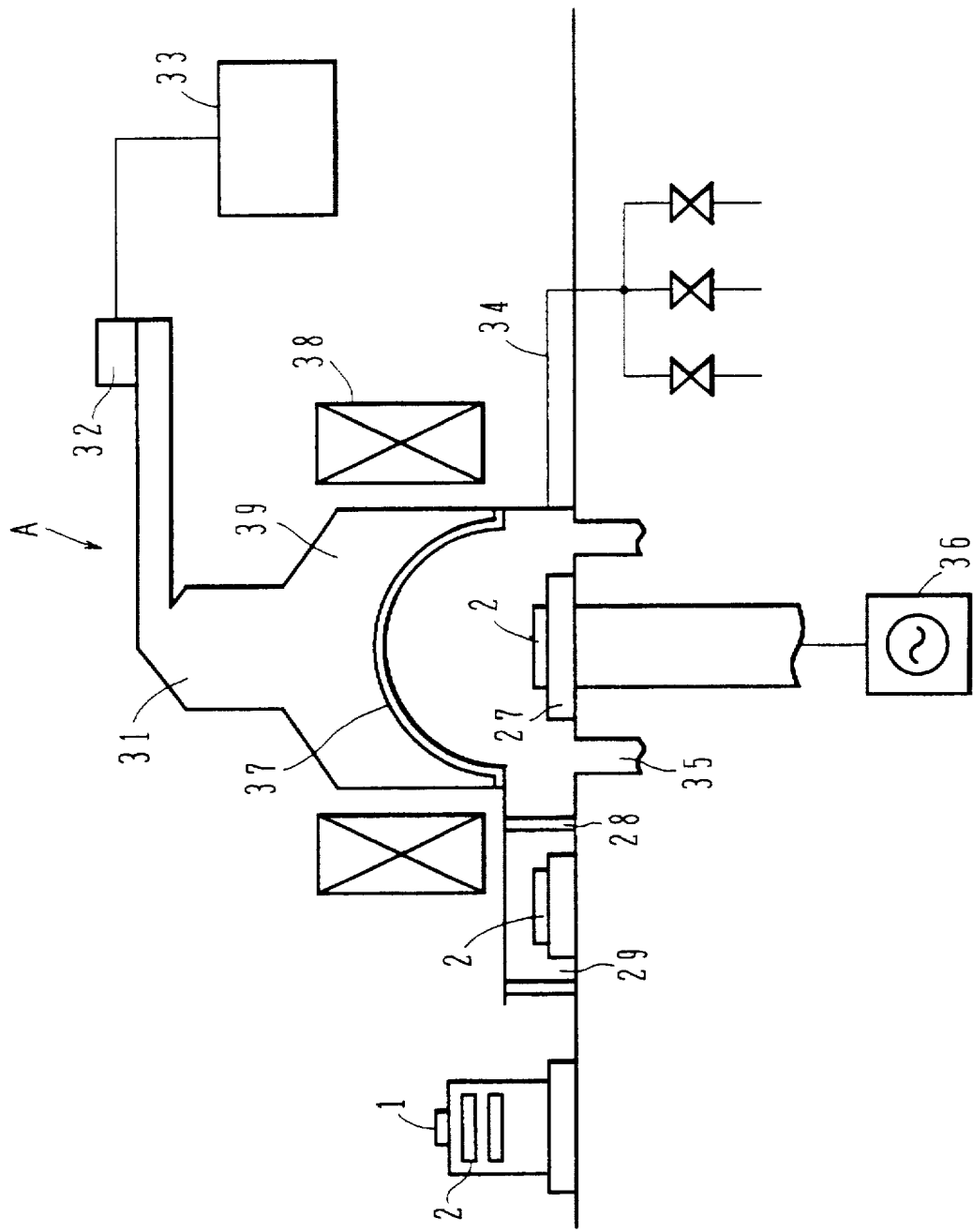
FIG. 2 is a schematic sectional view of a plasma asher used in an embodiment of the present invention.

FIG. 2 shows a schematic sectional view of a plasma asher A. A susceptor 27 for accommodating a wafer is disposed within a discharge tube 37. A high frequency power source 36 applies a radio frequency bias voltage on the susceptor 27. A microwave of 2.5 GHz generated from a magnetron 32 is irradiated to the discharge tube 37 from above via a waveguide 31 and a circular waveguide 39. The discharge tube 37 is provided with a gas inlet tube 34 for introducing reactive gas, and an evacuating port 35 for evacuating gas present inside the discharge tube. The magnetron 32 is supplied with electric power from a magnetron power source 33.

An electromagnetic coil 38 for establishing a magnetic field inside the discharge tube 37 is disposed around the tube.

The discharge tube 37 is connected to the subsidiary chamber 29 via a shutter 28. Here, the plasma asher A is connected in line with the baking apparatus B and the resist coating apparatus C shown in FIG. 1.

A wafer 2 taken out of the wafer carrier 1 is transported to the discharge tube 37 of the plasma asher A thus constructed via the subsidiary chamber 29, and is mounted on the susceptor 27.

$O_2$ gas is supplied to the discharge tube 37 from the gas inlet tube 34 at a flow rate of 800 sccm. For maintaining a pressure of 1.2 Torr, the discharge tube 37 is evacuated from the evacuating port 35. When a microwave of 400 mW is generated from the magnetron 32, plasma is generated within the discharge tube 37 by interaction between the magnetic field generated by the electromagnetic coil 38 and the microwave. The surface of the wafer 2 is processed for three minutes in a vapor phase. Thereafter, the wafer 2 is taken out of the discharge tube 37 and, immediately thereafter, baked in the baking apparatus B shown in FIG. 1.

Here, description has been given in this embodiment that $O_2$ gas is employed as a reactive gas. However, other gas may also be employed provided that the gas molecules are dissociated by glow discharge to form atoms, ions or molecular radicals, which cause chemical reaction with atoms and molecules of compounds existing on the surface of the wafer to be treated. For example, $NF_3/H_2O$ gas may be employed. Although description has been made on plasma asher, other plasma etching apparatuses, for example, a down flow type dry etcher etc. may be used.

Thus, organic materials attached to the substrate surface can be removed by subjecting the substrate to plasma processing before heating. When a nitride film is formed on the substrate surface, formation of oxide film oxidizing function can prevent attachment of basic impurities.

Next, washing with mixed solution of sulfuric acid and hydrogen peroxide water will be described.

Figure 3:
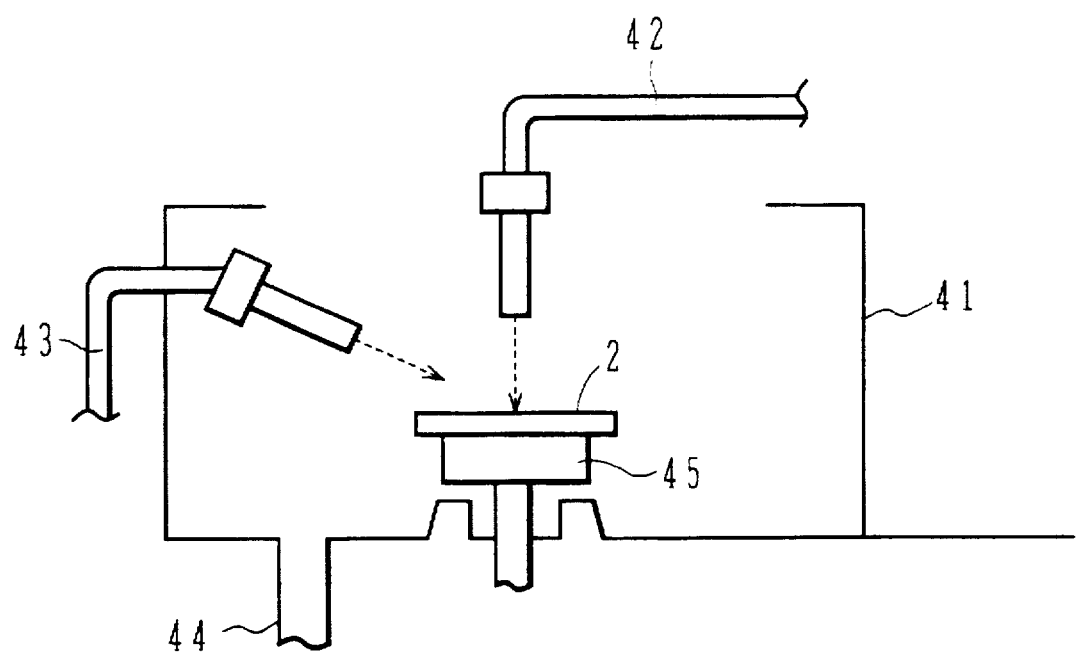
FIG. 3 is a schematic sectional view of a cleaning apparatus used in an embodiment of the present invention.

FIG. 3 shows a washing apparatus W using mixed solution of sulfuric acid and hydrogen peroxide water. Above a spinner chuck 45, which can suck and rotate a wafer 2 placed thereon, a dispenser tube 42 for dripping chemical liquid is disposed. A rinsing nozzle 43 for splashing pure water on the wafer 2 is disposed at a slanted position above the chuck 45. A process cup 41 for catching scattered chemical liquid from the wafer 2 is disposed around the spinner chuck 45. And a drain port 44 for recovery of liquid chemical scattered from the wafer 2 is disposed in the vicinity of the spinner chuck 45.

The wafer 2 formed with a silicon nitride film is sucked on the spinner chuck 45 and rotated at a high speed. While rotating the wafer 2, mixed solution of sulfuric acid and hydrogen peroxide water at a mixing ratio of 1:1 is dripped from the dispenser tube 42 for about 60 seconds. Rotating the wafer further on, pure water is injected on the wafer from the rinse nozzle 43 for washing and rinsing the wafer. Immediately thereafter, the wafer is baked by the baking apparatus B shown in FIG. 1.

Here, instead of the mixed solution of sulfuric acid and hydrogen peroxide water, other acidic chemical liquids, that can remove impurities such as organic materials on the substrate surface, may be employed. Examples are mixed solution of fluoric acid and pure at a mixing ratio of 2:100, phosphoric acid, or nitric acid, etc. may be employed.

Thus, washing with acidic chemical liquid, can remove organic materials and prevent attachment of basic impurities. Further, since washing is a wet process, it is expected that particles can also be removed.

Now, cleaning process by far ultraviolet irradiation will be described.

Figure 4:
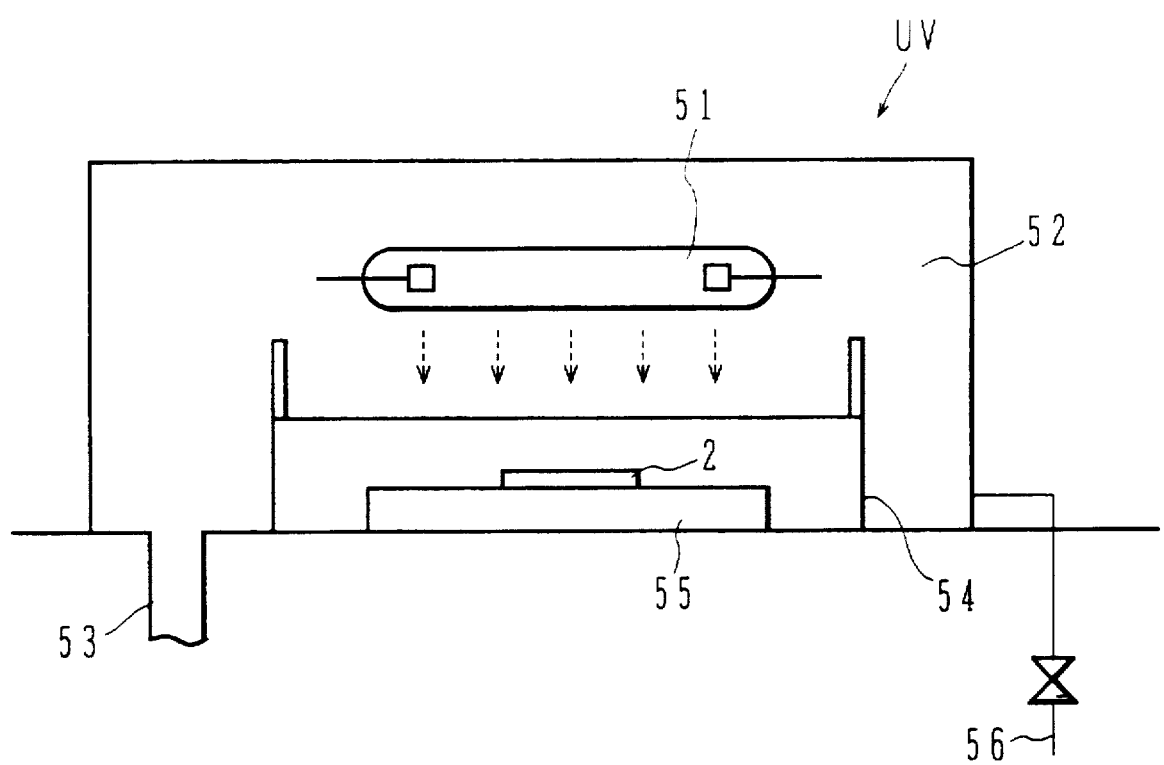
FIG. 4 is a schematic sectional view of a far ultraviolet ray irradiating apparatus used in an embodiment of the present invention.

FIG. 4 shows a far ultraviolet ray irradiating apparatus UV. A susceptor 55 for mounting a wafer 2 is disposed in a reaction chamber 52. The susceptor 55 and the wafer 2 are covered with a lid 54 enabled to open and close. A mercury lamp 51 is disposed above the lid 54. The mercury lamp 51 can generate a far ultraviolet radiation with wavelengths of 254 nm and 285 nm at an electric power of 20 W. An evacuating port 53 is disposed to the reaction chamber 52 for evacuating inside of the chamber. Piping 56 is connected to an oxygen gas source, and can supply oxygen to the reaction chamber 52 via a valve 56.

A wafer 2 formed with a silicon nitride film on the surface is mounted on the susceptor 55. The wafer 2 is covered with a lid 54. The reaction chamber 52 is filled with an oxygen atmosphere having a predetermined pressure. For irradiating the ultraviolet ray, the lid 54 is opened and the wafer is irradiated by the mercury lamp 51. Immediately thereafter, resist patterns are formed by the method described above.

Thus, contamination of such as organic materials on the wafer surface can be removed by oxygen etc. activated by irradiation of the far ultraviolet ray. As has been described, plasma treatment, washing by acidic chemical liquid, or far ultraviolet irradiation that is treated prior to heating of the substrate can prevent change in resist property caused by degree of contamination of the interface between a wafer and a resist film. Thus, a more accurate resist pattern can be formed.

Description of the embodiments of the present invention has been done on the case that a resist pattern is formed on silicon nitride film. However, the present invention is applicable also to the case of forming patterns on the surface formed by other materials. For example, it is also applicable to forming of a resist pattern on an interlayer insulating film such as phospho-silicate glass (PSG) film, or phospho-borosilicate glass (PBSG) film.

Further, the above description of the embodiments of the present invention has been done on the case that laser light having a wavelength of 248 nm is employed for exposure of the resist film. However, visible ray, ultraviolet ray, or electromagnetic wave such as x-ray, electron beam, ion beam, etc. may be employed as the exposing light.

The present invention has been described above in relation to preferred embodiments. The present invention is not limited to what has been described in embodiments. It will be apparent to those skilled in the art that various changes, substitutes, combinations and improvements can be made within the scope and spirit of the appended claims.

I claim:

1. A method of manufacturing a semiconductor device comprising the steps of:

providing a substrate having a first surface;

heating said first surface of the substrate at a temperature not less than 200° C.;

cooling said first surface of the substrate directly after said heating step;

forming a resist film on said first surface of said substrate using a chemically amplified resist directly after said cooling step;

selectively exposing a patterning region of said resist film;

developing said resist film to form a resist pattern; and etching the first surface of said substrate to produce a second surface using said resist pattern as a mask.

2. A method of manufacturing a semiconductor device according to claim 1, further comprising, before said step of heating, the step of exposing said first surface of the substrate in a plasma of a gas, which can chemically react with said substrate surface.

3. A method of manufacturing a semiconductor device according to claim 2, wherein said step of exposing said first surface of the substrate in a plasma is done in a plasma generated under application of magnetic field and microwave.

4. A method of manufacturing a semiconductor device according to claim 1, further comprising, before said step of heating, the steps of:

dipping said first surface of the substrate in an acidic chemical liquid; and rinsing said first surface of the substrate by pure water.

5. A method of manufacturing a semiconductor device according to claim 4 wherein said acidic chemical liquid is at least one selected from a group consisting of mixed solution of sulfuric acid and hydrogen peroxide water, mixed solution of fluoric acid and pure water, phosphoric acid, and nitric acid.

6. A method of manufacturing a semiconductor device according to claim 1, further comprising, before said step of heating, the step of irradiating ultraviolet ray on said first surface of the substrate in an atmosphere including oxygen, which ultraviolet ray having a wavelength capable of ozonizing oxygen.

7. A method of manufacturing a semiconductor device according to claim 1, wherein said cooling step cools the substrate to room temperature.

8. A method of manufacturing a semiconductor device according to claim 1, wherein said heating step is performed for a sufficiently long period for removing alkaline impurities from the surface of the substrate.

9. A method of manufacturing a semiconductor device according to claim 1, wherein said step of forming a resist film is performed immediately after said step of cooling.

10. A method of manufacturing a semiconductor device according to claim 9, wherein said steps of heating and cooling are performed in a vacuum chamber, and said step of forming a resist film comprises taking said substrate out of the vacuum chamber and immediately forming a resist film.

11. A method of manufacturing a semiconductor device according to claim 2, wherein said step of heating is performed immediately after said step of exposing said first surface of the substrate.

12. A method of manufacturing a semiconductor device according to claim 4, wherein said step of heating is performed immediately after said step of rinsing.

13. A method of manufacturing a semiconductor device according to claim 6, wherein said step of heating is performed immediately after said step of irradiating ultraviolet ray.

14. A method of manufacturing a semiconductor device according to claim 7, wherein said room temperature is in a range of 18° C. to 25° C.

15. A method of manufacturing a semiconductor device according to claim 1, wherein said step of heating does not accompany deposition, nor etching.

16. A method of manufacturing a semiconductor device comprising the steps of:

providing a semiconductor substrate having a first surface subject to contamination of alkaline impurity;

heating said first surface of the semiconductor substrate at 200° C. or above for a time period sufficient to remove alkaline impurity adhered on the first surface of the substrate;

directly following said step of heating the first surface of the substrate, cooling the first surface of the heated substrate; and directly following said step of cooling the substrate, forming a chemically amplified resist film on the first surface of the semiconductor substrate, the chemically amplified resist film including an acid generating agent.

17. A method of manufacturing a semiconductor device according to claim 16, further comprising the steps of:

selectively exposing a patterning region of said resist film;

developing said resist film to form a resist pattern; and etching said surface of said substrate to produce a second surface using said resist pattern as a mask.

18. A method of manufacturing a semiconductor device according to claim 17, further comprising, before said step of heating, the step of exposing said first surface of the substrate in a plasma of a gas, which can chemically react with said substrate surface.

19. A method of manufacturing a semiconductor device according to claim 18, wherein said step of exposing said first surface of the substrate in a plasma is done in a plasma generated under application of magnetic field and microwave.

20. A method of manufacturing a semiconductor device according to claim 17, further comprising, before said step of heating, the steps of:

dipping said first surface of the substrate in an acidic chemical liquid; and rinsing said first surface of the substrate by pure water.

21. A method of manufacturing a semiconductor device according to claim 20 wherein said acidic chemical liquid is at least one selected from a group consisting of mixed solution of sulfuric acid and hydrogen peroxide water, mixed solution of fluoric acid and pure water, phosphoric acid, and nitric acid.

22. A method of manufacturing a semiconductor device according to claim 17, further comprising, before said step of heating, the step of irradiating ultraviolet ray on said first surface of the substrate in an atmosphere including oxygen, which ultraviolet ray having a wavelength capable of ozonizing oxygen.

23. A method of manufacturing a semiconductor device according to claim 17, wherein said cooling step cools the substrate to room temperature.

24. A method of manufacturing a semiconductor device according to claim 16, wherein said step of forming a resist film is performed immediately after said step of cooling.

25. A method of manufacturing a semiconductor device according to claim 24, wherein said steps of heating and cooling are performed in a vacuum chamber, and said step of forming a resist film comprises taking said substrate out of the vacuum chamber and immediately forming a resist film.

26. A method of manufacturing a semiconductor device according to claim 18, wherein said step of heating is performed immediately after said step of exposing said first surface of the substrate.

27. A method of manufacturing a semiconductor device according to claim 20, wherein said step of heating is performed immediately after said step of rinsing.

28. A method of manufacturing a semiconductor device according to claim 22, wherein said step of heating is performed immediately after said step of irradiating ultraviolet ray.

29. A method of manufacturing a semiconductor device according to claim 23, wherein said room temperature is in a range of 18° C. to 25° C.

30. A method of manufacturing a semiconductor device according to claim 16, wherein said step of heating does not accompany deposition, nor etching.

* * * * *